US011737246B2

(12) United States Patent
Chen et al.

(10) Patent No.: US 11,737,246 B2
(45) Date of Patent: Aug. 22, 2023

(54) DUAL-RADIATOR COOLING DEVICE

(71) Applicant: QUANTA COMPUTER INC., Taoyuan (TW)

(72) Inventors: Chao-Jung Chen, Taoyuan (TW); Yu Nien Huang, Taoyuan (TW); Sin-Hong Lien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 65 days.

(21) Appl. No.: 17/393,725

(22) Filed: Aug. 4, 2021

(65) Prior Publication Data

US 2022/0346282 A1 Oct. 27, 2022

Related U.S. Application Data

(60) Provisional application No. 63/180,463, filed on Apr. 27, 2021.

(51) Int. Cl.
*H05K 7/20* (2006.01)
*F28D 15/02* (2006.01)
*F28D 15/00* (2006.01)
*F28F 9/00* (2006.01)

(52) U.S. Cl.
CPC ..... *H05K 7/20781* (2013.01); *H05K 7/20272* (2013.01); *H05K 7/20736* (2013.01); *F28D 15/00* (2013.01); *F28D 2015/0216* (2013.01); *F28F 9/00* (2013.01)

(58) Field of Classification Search
None
See application file for complete search history.

(56) References Cited

U.S. PATENT DOCUMENTS

| 5,582,239 | A | * | 12/1996 | Tsunoda | F28D 1/05341 |
| | | | | | 29/890.052 |
| 7,185,513 | B2 | * | 3/2007 | Bush | F24F 1/0071 |
| | | | | | 62/515 |
| 10,082,845 | B2 | * | 9/2018 | Yatskov | H05K 7/20572 |
| 11,246,241 | B1 | * | 2/2022 | Ross | F24F 1/0063 |
| 11,391,521 | B2 | * | 7/2022 | Yatsuyanagi | F28F 13/04 |
| 2010/0226094 | A1 | * | 9/2010 | Attlesey | H05K 7/20772 |
| | | | | | 361/699 |
| 2017/0074591 | A1 | * | 3/2017 | Kim | F28D 1/0417 |
| 2017/0135249 | A1 | * | 5/2017 | Jensen | H05K 7/20736 |
| 2017/0227242 | A1 | * | 8/2017 | Kimura | H05K 7/2069 |
| 2018/0038660 | A1 | * | 2/2018 | Dinnage | F28D 15/0266 |
| 2020/0284480 | A1 | * | 9/2020 | Tolouei Asbforoushani | |
| | | | | | F25B 25/005 |
| 2021/0207900 | A1 | * | 7/2021 | Nakamura | F24F 13/222 |

* cited by examiner

*Primary Examiner* — Courtney L Smith
(74) *Attorney, Agent, or Firm* — Nixon Peabody LLP

(57) ABSTRACT

A cooling device for a computing system is disclosed. The cooling device includes an inlet conduit, a first radiator, a second radiator, a connecting conduit, and an outlet conduit. The first radiator has a first top tank and a first bottom tank. The first top tank is coupled to the inlet conduit. The second radiator has a second top tank and a second bottom tank. The second radiator is positioned parallel to the first radiator. The first radiator and the second radiator are positioned at an angle relative to a bottom panel of the computing system. The connecting conduit has a first end coupled to the first bottom tank and a second end coupled to the second bottom tank. The outlet conduit is coupled to the second top tank.

17 Claims, 5 Drawing Sheets

DUAL-RADIATOR COOLING DEVICE

CROSS-REFERENCE TO RELATED APPLICATIONS

This application claims priority from and benefit of U.S. Provisional Patent Application Ser. No. 63/180,463, filed on Apr. 27, 2021 titled "Cross Flow Of Dual-Radiators In Chassis Cooling Device," which is hereby incorporated by reference herein in its entirety.

FIELD OF THE INVENTION

The present invention relates generally to a cooling device, and more specifically, to a dual-radiator device for cooling electronic components in a server system.

BACKGROUND OF THE INVENTION

Cooling devices, such as cold plates, typically dissipate heat produced by electronic components in a server system. A liquid coolant is used to aid in transferring the heat from the electronic component to a cooling assembly having the cooling device. Cooling devices using only one radiator may not maximize surface area for cooling the liquid coolant. Furthermore, the design of the cooling device may also impact the cooling efficiency of the server system. Another way to assist in the transfer of heat from an area of higher temperature to an area of lower temperature is by adding components that promote thermal conduction or convection. Regardless of the method being used, cooling devices with high cooling efficiency remain desirable.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cooling device for a computing system is disclosed. The cooling device includes an inlet conduit, a first radiator, a second radiator, a connecting conduit, and an outlet conduit. The first radiator has a first top tank and a first bottom tank. The first top tank is coupled to the inlet conduit. The second radiator has a second top tank and a second bottom tank. The second radiator is positioned parallel to the first radiator. The first radiator and the second radiator are positioned at an angle relative to a bottom panel of the computing system. The connecting conduit has a first end coupled to the first bottom tank and a second end coupled to the second bottom tank. The outlet conduit is coupled to the second top tank.

According to a configuration of the above implementation, the first radiator and the second radiator each include a tube extending from the first and second top tanks to the respective first and second bottom tanks.

In a further aspect of the above implementation, the first radiator and the second radiator each include fins located between the first and second top tanks and the respective bottom tanks.

In another aspect of the above implementation, the cooling device also includes a fan directing airflow through the first radiator and the second radiator.

According to another configuration of the above implementation, the cooling device also includes a pump fluidly coupled to the outlet conduit.

In a further aspect of the above implementation, the cooling device also includes an external conduit coupled to the pump.

In yet a further aspect of the above implementation, the pump is coupled to a control unit.

In a further aspect of the above implementation, the cooling device also includes a stand on which the first radiator and the second radiator are mounted at the angle relative to the bottom panel.

According to a configuration of the above implementation, wherein the first radiator and the second radiator dissipate heat at a rate of between about 8.5-20 Kilo Watts.

According to another aspect of the present disclosure, a cooling assembly for a computing system is disclosed. The cooling assembly includes a housing having a bottom panel and a cooling device. The cooling device includes an inlet conduit, a pair of radiators, a connecting conduit, and an outlet conduit. The inlet conduit conducts a liquid coolant. The pair of radiators is arranged in a parallel configuration. The pair of radiators is angled at a predetermined angle relative to the bottom panel. The predetermined angle is greater than 0 degrees and less than 90 degrees. The inlet conduit is coupled to a first radiator of the pair of radiators. The connecting conduit is coupled between the first radiator and a second radiator of the pair of radiators. The connecting conduit flows the liquid coolant between the first radiator and the second radiator. The outlet conduit is coupled to the second radiator. The outlet conduit expels the liquid coolant from the second radiator.

According to a configuration of the above implementation, the first radiator and the second radiator each include tubes extending from the first and second top tanks to the respective first and second bottom tanks.

In a further aspect of the above implementation, the first radiator and the second radiator each include fins located between the first and second top tanks and the respective first and second bottom tanks.

In another aspect of the above implementation, the cooling device also includes a fan directing airflow through the first radiator and the second radiator.

According to another configuration of the above implementation, the cooling device also includes a pump fluidly coupled to the outlet conduit.

In a further aspect of the above implementation, the cooling device also includes an external conduit coupled to the pump.

In yet a further aspect of the above implementation, the pump is coupled to a control unit.

In a further aspect of the above implementation, the cooling device also includes a stand on which the first radiator and the second radiator are mounted at the angle relative to the bottom panel.

According to another aspect of the present disclosure, a method for cooling a computing system using a cooling device thermally coupled to the computing system is disclosed. The method includes receiving a liquid coolant into an inlet conduit in the cooling device. The method also includes flowing the liquid coolant from the inlet conduit to a first top tank of a first radiator in the cooling device. The method further includes moving the liquid coolant, via a connecting conduit, between a first bottom tank of the first radiator and a second bottom tank of a second radiator in the cooling device. The second radiator is parallel to the first radiator and angled relative to a bottom panel of the cooling device. The method further includes expelling the liquid coolant, via an outlet conduit in the cooling device, from a second top tank of the second radiator. The method further includes cooling at least one of the first radiator and the second radiator with an airflow through the cooling device.

In a further aspect of the above implementation, the liquid coolant flows through tubes in each of the first radiator and the second radiator extending from the first and second top tanks to the respective first and second bottom tanks.

In yet a further aspect of the above implementation, the cooling further comprises directing the airflow through the first radiator and the second radiator using a fan.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1:
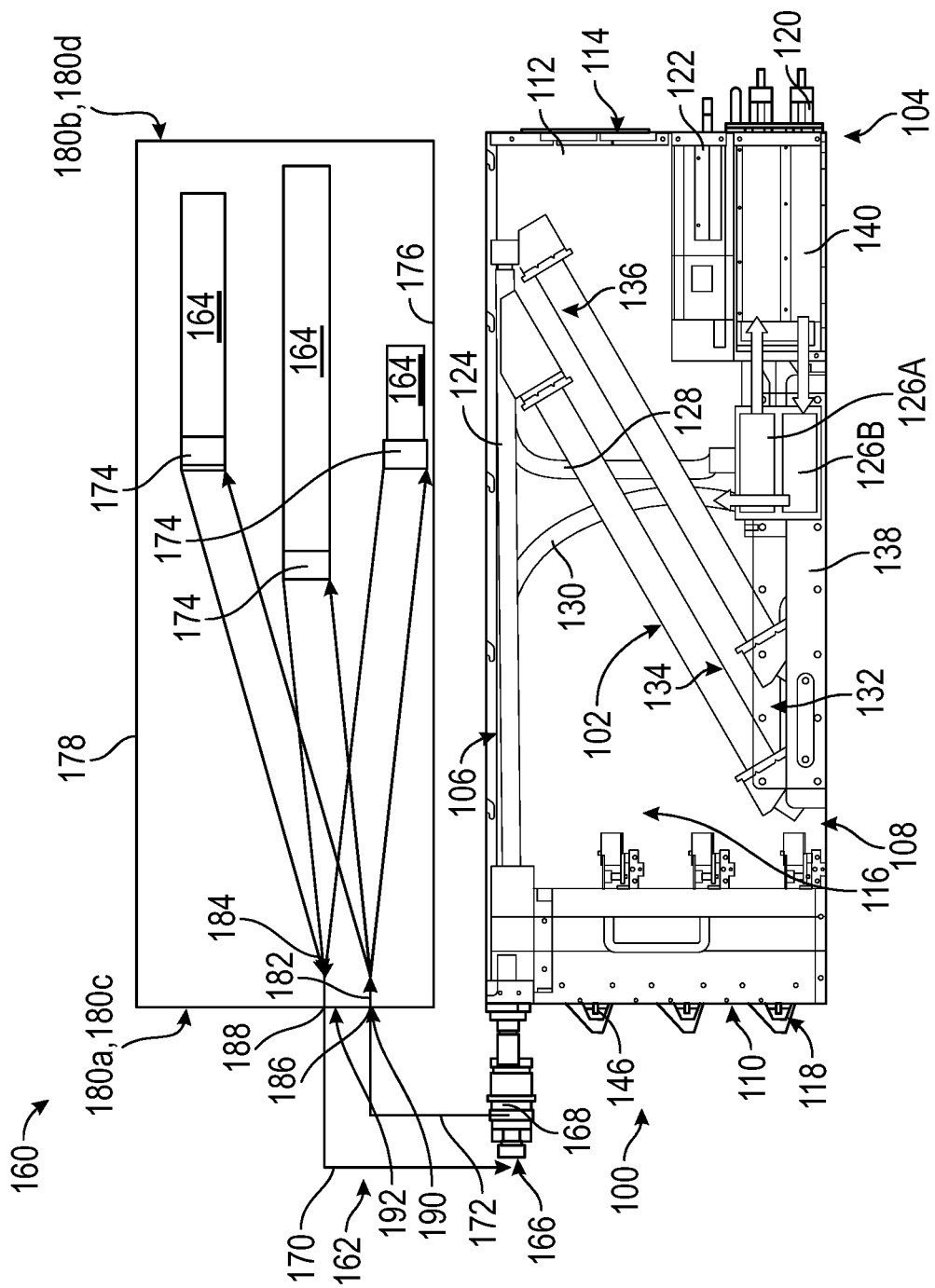
FIG. 1 is a partially-transparent schematic side view of an example cooling assembly connected to a server system, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present disclosure is directed to a cooling device, and more specifically, to a dual-radiator cooling device in a cooling assembly that uses a liquid coolant for cooling electronic components. The cooling device cools the liquid coolant heated by electronic components and recirculates the cooled liquid coolant to cool the electronic components. The dual-radiator feature enables cooling the liquid coolant with higher efficiency than using a single radiator due, at least in part, to increased surface area for cooling.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
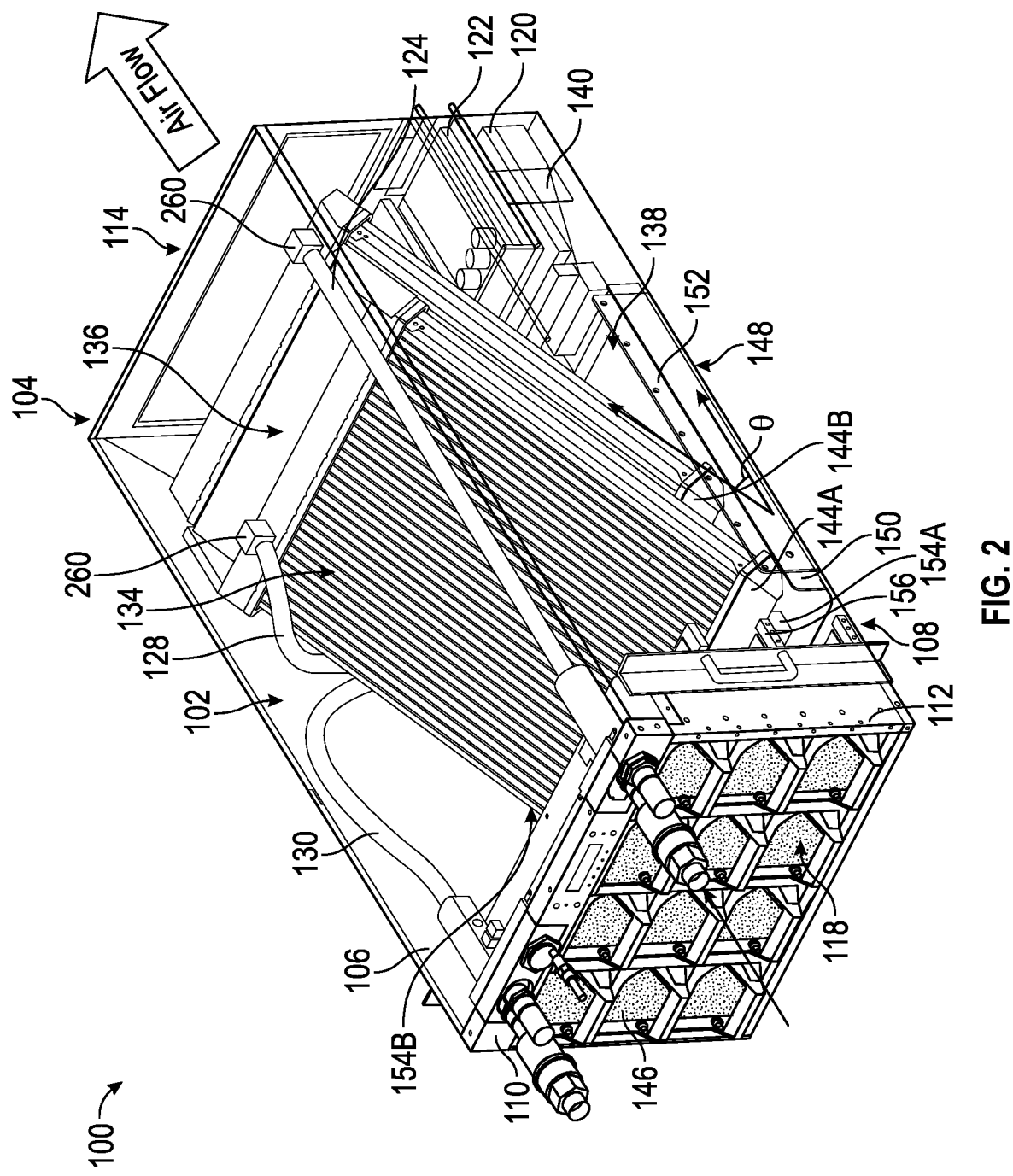
FIG. 2 is a partially-transparent front perspective view of the example cooling assembly of FIG. 1, according to certain aspects of the present disclosure.

Referring to the figures, FIG. 1 shows a partially-transparent schematic side view of a cooling assembly 100 in a server system 160, while FIG. 2 shows a partially-transparent front perspective view of the cooling assembly 100. The cooling assembly 100 is thermally and fluidly coupled to the server rack 162 in the server system 160 and includes a cooling device 102. The cooling assembly 100 is used to cool one or more heat-generating electronic components 164 of the server rack 162. In non-limiting implementations, the heat-generating electronic components 164 may include storage servers, application servers, switches, high-powered components, processors, in-line isolators, optical isolators, output isolators, faraday rotators, power transistors, central processing units, graphics processing units, microcontrollers, microprocessors, embedded processors, media processors, and the like. In the example implementation shown in FIGS. 1-2, while the heat-generating electronic components 164 are placed in a horizontal orientation in the server rack 162, the server rack 162 may be configured to support a vertical orientation of the heat-generating electronic components 164. Each heat-generating electronic component 164 may be coupled to a cooling block 174. In non-limiting implementations, the cooling block 174 may be a water block, a heatsink, a cold plate, a cooling plate, heat exchanger, etc.

The server rack 162 includes a top frame 178 and a bottom frame 176. The bottom frame 176 may include wheels or sliders that allow the server rack 162 to be moved to desired locations in a data center. The cooling assembly 100 is mounted on the bottom frame 176. The bottom frame 176 supports vertical posts 180a, 180b, 180c, and 180d. The top frame 178 connects the top ends of the vertical posts 180a, 180b, 180c, and 180d. Each of the vertical posts 180a, 180b, 180c, and 180d may further include holes to allow pins to be inserted to support shelves supported by the vertical posts 180a, 180b, 180c, and 180d.

The server rack 162 supports a cold manifold 182 and a hot manifold 184 that span between the bottom frame 176 and the top frame 178 of the server rack 162. The cold manifold 182 is fluidly connected to the cooling assembly 100 via a cold coolant pipe 186 near the bottom of the server rack 162. The hot manifold 184 is fluidly connected to the cooling assembly 100 via a hot coolant pipe 188 near the bottom of the server rack 162. Each of the heat-generating electronic components 164 is fluidly connected to coolant connectors 190 and 192 that may be couplers spaced along a length of the cold manifold 182 and the hot manifold 184 respectively.

The heat-generating electronic components 164 may include an internal network of fluid conduits that circulate a liquid coolant throughout internal elements of the heat-generating electronic components 164. In a non-limiting example, one of the heat-generating electronic components 164 may be an application server that has internal cold plates in contact with processing devices within the chassis of the server system 160. The liquid coolant is provided by the cold manifold 182 through the coolant connector 190 and circulated through the cold plates to carry away heat generated by the processing devices. The liquid coolant is returned to the coolant connector 192 through the hot manifold 184. Thus, the liquid coolant flows into the heat-generating electronic components 164 from the cold coolant pipe 186 and the cold manifold 182. The liquid coolant will then circulate through internal components to absorb heat, and flow out of the heat-generating electronic components 164 through the hot manifold 184 to the hot coolant pipe 188. The heated liquid coolant will be then sent through the cooling assembly 100 to dissipate the heat.

Continuing to refer to FIGS. 1-2, the cooling device 102 includes an inlet conduit 124, a manifold 126, an outlet conduit 128, an external conduit 130, a connecting conduit 132, a first radiator 134, and a second radiator 136. The first radiator 134 and the second radiator 136 are stacked parallel to each other and angled relative to a bottom end of the cooling device 102. The first radiator 134 and the second radiator 136 are configured to remove heat from the liquid coolant as it passes through them. The inlet conduit 124 and the external conduit 130 circulate the liquid coolant through the first radiator 134 and the second radiator 136.

The manifold 126A and 126B are located near the support stand 138 and the second side panel 116. The manifold 126A may be coupled to the outlet conduit 128 and the pump 140. As illustrated in FIGS. 1-2, the inlet conduit 124 is shown coupled to the second radiator 136. The connecting conduit 132 fluidly connects the first radiator 134 to the second radiator 136. The outlet conduit 128 fluidly connects the first radiator 134 to the manifold 126A. The manifold 126B is also fluidly connected to the pump 140 and the external conduit 130. Thus, in the illustrated implementation of FIGS. 1-2, the direction of flow through the cooling assembly 100 is from the inlet conduit 124 to the second radiator 136 to the connecting conduit 132 to the first radiator 134 to the outlet conduit 128 to the manifold 126A to the pump 140 to the manifold 126B to the external conduit 130.

The inlet conduit 124 and the outlet conduit 128 are generally located above the first radiator 134 and the second radiator 136. The inlet conduit 124, the connecting conduit 132, the outlet conduit 128, and the external conduit 130 may be fabricated from the same material such as, but not limited to, plastic, metal, rubber, etc. In other implementations, any of the inlet conduit 124, the connecting conduit 132, the outlet conduit 128, and the external conduit 130 may be fabricated from the same or a different material. Fittings 260 are used to connect (i) the inlet conduit 124 and the second radiator 136, (ii) the second radiator 136 and the connecting conduit 132, (iii) the connecting conduit 132 and the first radiator 134, (iv) the first radiator 134 and the outlet conduit 128, (v) the inlet conduit 124 and the manifold 126, and (vi) the external conduit 130 and the manifold 126. The fittings 260 enable a fluid connection between the connecting components on either side. In non-limiting implementations, the fittings 260 may be a connector, an extender, an elbow, a reducer, a tee, a bushing, a coupling, an adapter, a plug, a cap, a valve, etc.

The cooling device 102 is disposed within a fully-sealed housing 104. The housing 104 includes a top panel 106, a bottom panel 108, a front panel 110, a first side panel 112, a rear panel 114, and a second side panel 116. The panels 106-116 of the housing 104 may be fabricated from a thermally-conductive material such as, but not limited to, steel or aluminum. The housing 104 may be fabricated from a thermally-insulated material such as, but not limited to, a plastic material. The housing 104 further includes a pump 140, a power supply 120, a control unit 122, a fan wall 118, and a support stand 138.

The pump 140 directs flow of the liquid coolant within the cooling assembly 100. The pump 140 is located near the power supply 120 and the control unit 122, near the rear panel 114. The pump 140 and the control unit 122 are generally located in line with each other and are electrically connected. The power supply 120 is electrically coupled to the pump 140 to provide power to the pump motor. In the illustrated implementation, there are two pumps 140. In other implementations, there may be any number of pumps 140. In non-limiting implementations, the pump 140 may be a hydraulic pump, a rotary pump, a piston pump, a diaphragm pump, etc.

The pump 140 is fluidly coupled to the manifolds 126A and 126B, the outlet conduit 128, and the external conduit 130. The pump 140 removes the heated liquid coolant flowing from the hot coolant pipe 188 and recirculates the cooled liquid coolant back through the cold coolant pipe 186. The control unit 122 may be configured to execute control processes and switching commands to the pump 140.

Thus, the control unit 122 may control the pump 140 to speed up or slow down, for example, in order to reach a desired flow rate or pressure.

The power supply 120 is coupled to the control unit 122 and the pump 140. The power supply 120 is located on the bottom panel 108 near the rear panel 114. The power supply 120 may supply at least enough power to activate the control unit 122 and the pump 140, while the cooling assembly 100 is in use. In the illustrated implementation of FIGS. 1-2, there is one power supply 120. In other implementations, there may be multiple power supplies similar to the power supply 120 located within the housing 104.

The control unit 122 is in line with the power supply 120, near the rear panel 114. The control unit 122 may meter and control the flow for one or more pumps 140 to increase or decrease the heat removal rate from the computer components. The control unit 122 may also control the speed of one or more fans modules 146 to increase or decrease the heat removal rate from the computer components.

The fan wall 118 includes a set of fan modules 146 that generate airflow from the front panel 110 to the rear panel 114. The fan modules 146 of the fan wall 118 are located along the front panel 110 of the housing 104. In the non-limiting implementation shown in FIGS. 1-2, there are twelve fan modules 146 aligned in a three by four pattern. In other implementations, there may be more or less than twelve fan modules 146, aligned in any manner that constitute the fan wall 118. The fan modules 146 may be powered by the power supply 120. Airflow from the fan modules 146 cause air near the front panel 110 to be lower in temperature than air near the rear panel 114 by absorbing heat in the air surrounding the first radiator 134 and the second radiator 136. The inlet conduit 124 and the external conduit 130 are located on the front panel 110.

The support stand 138 is located on the bottom panel 108 and removably coupled to the first radiator 134 and the second radiator 136. The support stand 138 may be fabricated from a thermally-conductive or thermally-insulated materials such as, but not limited to, steel, aluminum, plastic, or glass. As further shown in FIG. 2, the support stand 138 may also include lateral slots 154A-154B for the first radiator 134 and the second radiator 136, respectively. The support stand 138 includes a base 150 with registration features 148 on the bottom panel 108 that allow attachment to the housing 104. A top surface 152 includes the lateral slots 154A-154B that allow insertion of a first bottom tank 144A or a second bottom tank 144B of the respective radiators 134, 136. The lateral slots 154A-154B are angled at an angle θ relative to the bottom panel 108. The angle θ may be adjusted by coupling the lateral slots 154A-154B and the first radiator 134 and the second radiator 136 to a rail 156. The rail 156 is located on the base 150 of the support stand 138. The lateral slots 154A-154B may vary in size in order to accommodate supporting an angle that complementary to the angle θ. Thus, the angle on the lateral slots 154A-154B is generally a 90-degree difference from the angle θ. When the first radiator 134 is positioned at an angle θ relative to the bottom panel 108, the angle θ may be between 0 degrees and 90 degrees, for example 22.5 degrees.

The housing 104 further includes a first connector 166 and a second connector 168 connected to a first conduit 170 and a second conduit 172, respectively, that supply the liquid coolant to the heat-generating electronic components 164. In non-limiting implementations, the first connector 166 and the second connector 168 may be a connector, a fitting, a coupling, a joint, an adapter, a valve, etc. The first connector 166 is located on an end of the inlet conduit 124 on the front panel 110. Similarly, the second connector 168 is located on an end of the external conduit 130 on the front panel 110. The first connector 166 is coupled to the first conduit 170. The second connector 168 is coupled to the second conduit 172.

During operation, after the liquid coolant has circulated through the cooling assembly 100, the liquid coolant exiting the cooling assembly 100 through the second connector 168 may be cooled liquid coolant. As the cooled liquid coolant flows through the second connector 168, the cooled liquid coolant may travel through the second conduit 172 to the cooling block 174 to cool the heat-generating electronic component 164. After the liquid coolant circulates to the heat-generating electronic component 164, the temperature of the liquid coolant increases from the heat of the heat-generating electronic component 164. Thereafter, the liquid coolant continues circulating through the first conduit 170, the first connector 166, and into the inlet conduit 124 to repeat the cycle continuously. Thus, the cooling assembly 100 is a closed-loop system.

Figure 3A:
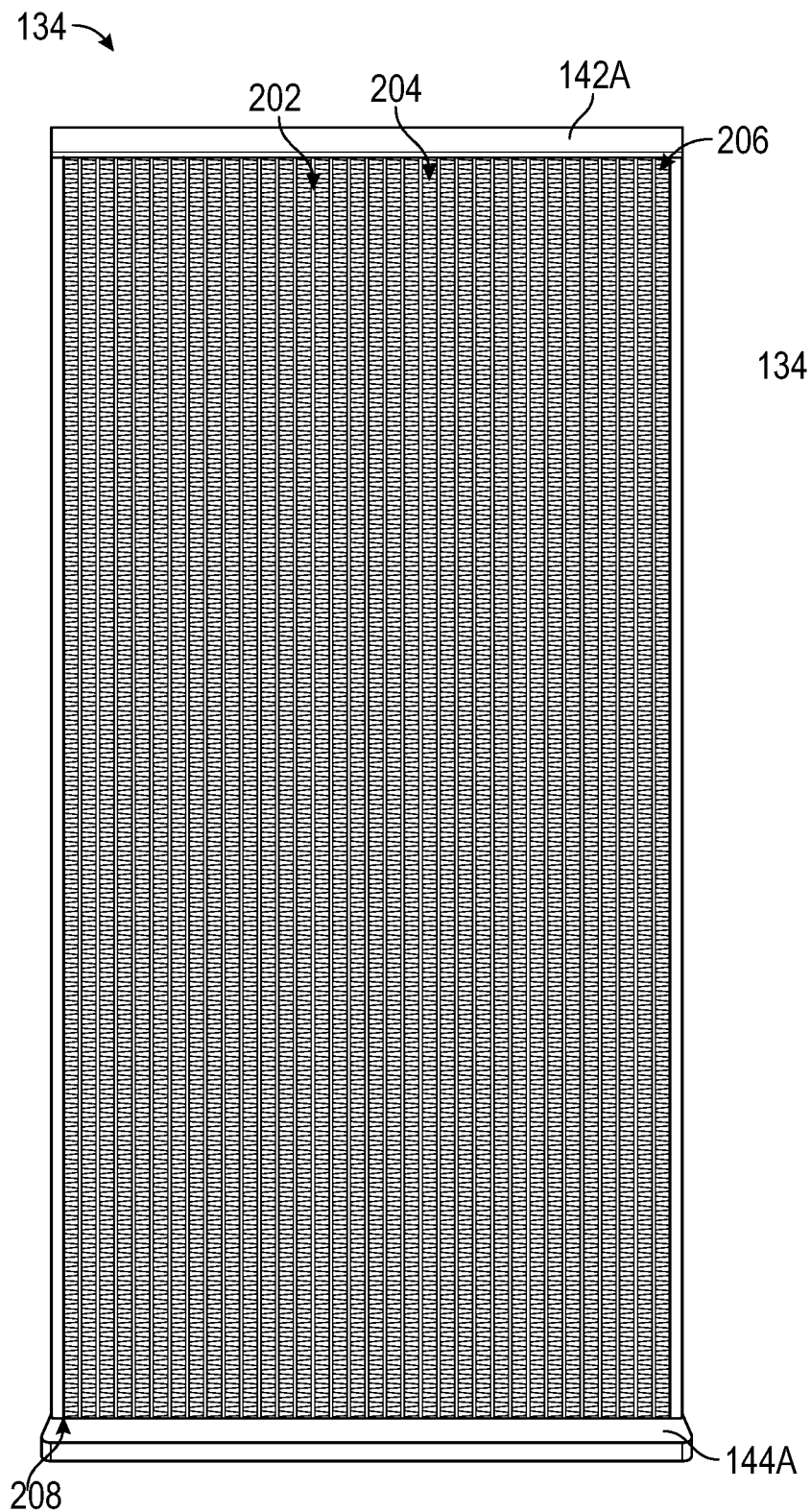
FIG. 3A is a front view of an example radiator, according to certain aspects of the present disclosure.
Figure 3B:
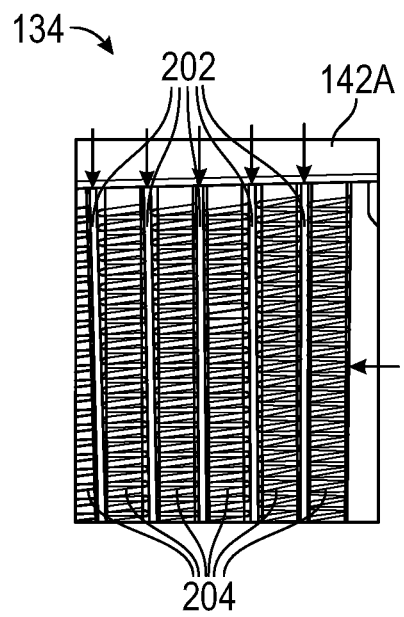
FIG. 3B is a close-up view of the radiator of FIG. 3A showing example radiator tubes and fins, according to certain aspects of the present disclosure.

FIG. 3A is a front view of the first radiator 134 in FIG. 1. FIG. 3B is a close-up view showing internal structure of the first radiator 134. The first radiator 134 is the same as or similar to the second radiator 136. The first radiator 134 is used to decrease the temperature of the liquid coolant. As illustrated in FIG. 3A, the first radiator 134 includes a first top tank 142A and a first bottom tank 144A. There are tubes 202 and fins 204 (shown in more detail in FIG. 3B) generally spanning the entirety of the first top tank 142A and the first bottom tank 144A. The tubes 202 are configured to transport the liquid coolant. The tubes 202 are interconnected, and thus curve along the first top tank 142A and the first bottom tank 144A such that the liquid coolant may flow continuously through the tubes 202. In this implementation, there are approximately thirty-three tubes 202. In other implementations, there may be more or less than thirty-three tubes 202. Thus, there may be a first opening 206 near the first top tank 142A or the first bottom tank 144A that receives the liquid coolant into the tube 202. Similarly, there may be a second opening 208 near the first top tank 142A or the first bottom tank 144A when the liquid coolant exits the tubes 202. The tubes 202 are in the path of airflow and further assist in decreasing the temperature of the liquid coolant by transferring heat out of the tubes 202 and into the air.

As shown in FIG. 3B, the fins 204 are located on either side of the tubes 202. The fins 204 may assist the tubes 202 in decreasing the temperature of the liquid coolant flowing through the tubes 202 by providing additional surface area to dissipate the heat. Furthermore, the fins 204 are in contact with the airflow from the fan modules 146 (shown in FIG. 1) to more efficiently dissipate the heat. When the first radiator 134 is positioned at an angle relative to the bottom panel 108 (shown in FIG. 1), the surface area for airflow in contact with the fins 204 and the tubes 202 of the radiator increases relative to the surface area for airflow, when the first radiator 134 is positioned in a vertical position (e.g., 90 degrees from the bottom panel 108 in FIG. 1). The fins 204 and tubes 202 of the first radiator 134 may be fabricated from a durable, thermally-conductive material such as, but not limited to, steel, aluminum, brass, copper, cast iron, and the like.

Figure 4:
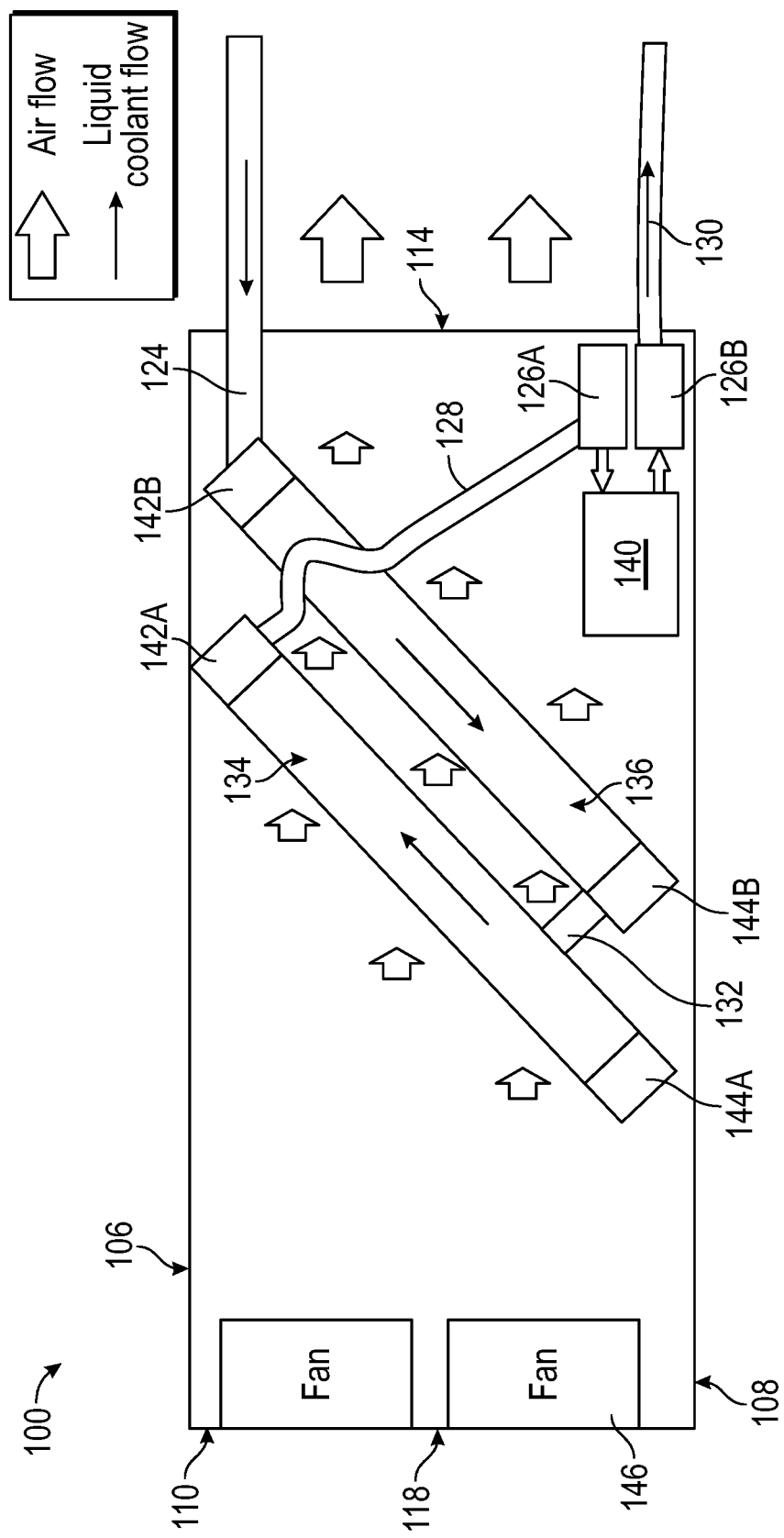
FIG. 4 is a schematic side view depicting a flow direction of liquid coolant in the example cooling assembly of FIG. 1, according to certain aspects of the present disclosure.
Figure 5:
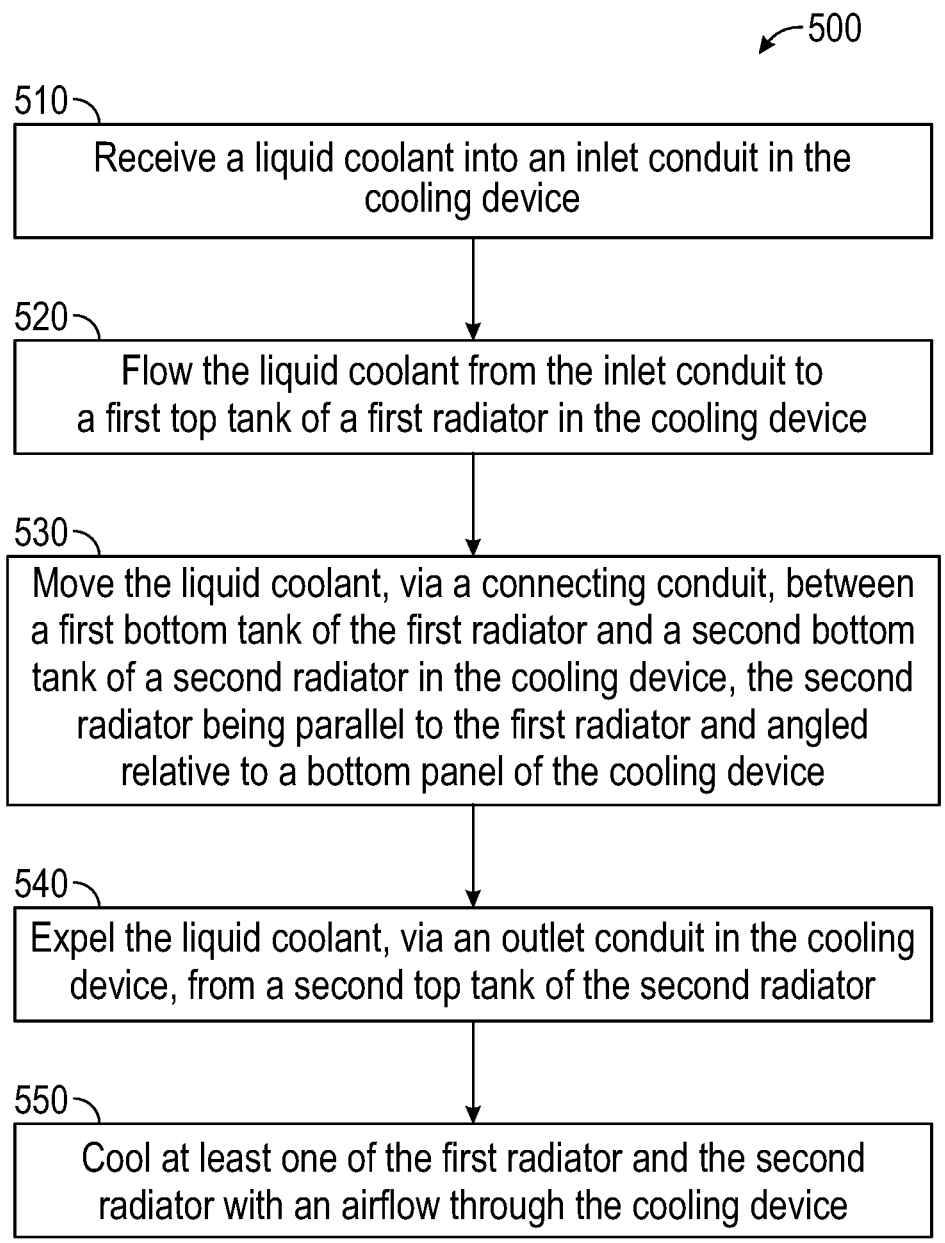
FIG. 5 is a block diagram depicting a method for cooling a computing system using the cooling assembly of FIGS. 1-2, according to certain aspects of the present disclosure.

FIG. 4 is a schematic side view depicting a flow direction of liquid coolant in the example cooling assembly 100, while FIG. 5 is a block diagram depicting a method 500 for cooling a computing system using a cooling device (e.g., the cooling device 102) thermally coupled to the computing system. The method 500 includes steps 510-550 and is described in conjunction with FIG. 4. In step 510, a liquid coolant is received into an inlet conduit in the cooling device. In the illustrated embodiment of FIG. 4, heated liquid coolant carrying heat dissipated by electronic components of the computing system is received into the inlet conduit 124.

In step 520, the liquid coolant is flowed from the inlet conduit to a first top tank of a first radiator in the cooling device. In the illustrated embodiment of FIG. 4, the heated liquid coolant is flowed from the inlet conduit 124 to the second top tank 142B of the second radiator 136. As discussed above with respect to FIGS. 1-2, the liquid coolant is circulated through the second radiator 136 and flowed into the second bottom tank 144B of the second radiator 136.

In step 530, the liquid coolant is moved, via a connecting conduit, between a first bottom tank of the first radiator and a second bottom tank of a second radiator positioned parallel to the first radiator and angled relative to a bottom panel of the cooling device. In the illustrated embodiment of FIG. 4, the second radiator 136 is positioned parallel to the first radiator 134 and angled relative to the bottom panel 108. The liquid coolant is moved, via the connecting conduit 132 between the second bottom tank 144B of the second radiator 136 and a first bottom tank 144A of the first radiator 134.

In some implementations, the liquid coolant flows through tubes in each of the first radiator and the second radiator extending from the first and second top tanks to the respective first and second bottom tanks. In the illustrated embodiment of FIG. 4, the liquid coolant flows through tubes 202 (shown in FIGS. 3A-3B) in each of the first radiator 134 and the second radiator 136. The heat from the liquid coolant is dissipated as it flows through the first radiator 134 and the second radiator 136, thereby decreasing the temperature of the liquid coolant. The first radiator 134 and the second radiator 136 may dissipate heat at a rate between about 8.5 k Watts and 20 k Watts, which may be an improvement of at least 25% compared to a vertically positioned, single-radiator cooling device. For example, the first radiator 134 and the second radiator 136 may dissipate heat at a rate of 10,500 Watts. Therefore, the temperature of the liquid coolant at the inlet conduit 124 is reduced, allowing cooler liquid coolant to be provided by the external conduit 130.

In step 540, the liquid coolant is expelled, via an outlet conduit, from a second top tank of the second radiator. In the illustrated embodiment of FIG. 4, the liquid coolant is expelled, via an outlet conduit 128, from the first top tank 142A of the first radiator 134. The liquid coolant then flows into the manifold 126 and ejected into the external conduit 130 by the pump 140.

In step 550, at least one of the first radiator and the second radiator is cooled with an airflow through the cooling device. In some implementations, the cooling further comprises directing the airflow through the first radiator and the second radiator using a fan. In the illustrated embodiment of FIG. 4, the first radiator 134 and the second radiator 136, which dissipate heat from the liquid coolant, are cooled by airflow generated from the fan wall 118 having the fan modules 146.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cooling device for a computing system, the cooling device comprising:
    an inlet conduit;
    a first radiator having a first top tank and a first bottom tank, the first top tank being coupled to the inlet conduit;
    a second radiator having a second top tank and a second bottom tank, the second radiator being positioned parallel to the first radiator, the first radiator and the second radiator being positioned at a sloped angle relative to a bottom panel of the computing system;
    a connecting conduit having a first end coupled to the first bottom tank and a second end coupled to the second bottom tank;
    an outlet conduit coupled to the second top tank; and
    a support stand mountable on the bottom panel, wherein the computing system includes a front panel supporting a fan generating air flow in a path parallel to the bottom panel toward a rear panel of the computing system, the support stand including a first slot at the sloped angle and a second slot at the sloped angle lateral to the first slot, wherein the first radiator and the second radiator are mounted at the sloped angle relative to the bottom panel between the front panel and rear panel in the path of the air flow via respective insertion in the first slot and the second slot.

2. The device of claim 1, wherein the first radiator and the second radiator each include a tube extending from the first and second top tanks to the respective first and second bottom tanks.

3. The device of claim 2, wherein the first radiator and the second radiator each include fins located between the first and second top tanks and the respective first and second bottom tanks.

4. The device of claim 1, further comprising a fan directing airflow through the first radiator and the second radiator.

5. The device of claim 1, further comprising a pump fluidly coupled to the outlet conduit.

6. The device of claim 5, further comprising an external conduit coupled to the pump.

7. The device of claim 5, wherein the pump is coupled to a control unit.

8. The device of claim 1, wherein the first radiator and the second radiator dissipate heat at a rate of between about 8.5-20 Kilo Watts.

9. A cooling assembly for a computing system, the cooling assembly comprising:
    a housing having a bottom panel, a rear panel, and a front panel supporting a fan generating air flow in a path parallel to the bottom panel toward the rear panel;
    a cooling device comprising:
        an inlet conduit for conducting a liquid coolant;

a pair of radiators arranged in a parallel configuration, the pair of radiators being angled at a predetermined angle relative to the bottom panel, the predetermined angle being greater than 0 degrees and less than 90 degrees, the inlet conduit being coupled to a first radiator of the pair of radiators;

a connecting conduit coupled between the first radiator and a second radiator of the pair of radiators, the connecting conduit flowing the liquid coolant between the first radiator and the second radiator; and an outlet conduit coupled to the second radiator, the outlet conduit expelling the liquid coolant from the second radiator; and a support stand mounted on the bottom panel, the support stand including a first slot at the sloped angle and a second slot at the sloped angle, the second slot lateral to the first slot, wherein the first radiator and the second radiator are mounted at the sloped angle relative to the bottom panel between the front panel and rear panel in the path of the air flow via respective insertion in the first slot and the second slot.

10. The cooling assembly of claim 9, wherein the first radiator and the second radiator each include a tube extending from the first and second top tanks to the respective first and second bottom tanks.

11. The cooling assembly of claim 10, wherein the first radiator and the second radiator each include fins located between the first and second top tanks and the respective first and second bottom tanks.

12. The cooling assembly of claim 9, further comprising a pump fluidly coupled to the outlet conduit.

13. The cooling assembly of claim 12, further comprising an external conduit coupled to the pump.

14. The cooling assembly of claim 12, wherein the pump is coupled to a control unit.

15. A method for cooling a computing system using a cooling device thermally coupled to the computing system, the method comprising:

receiving a liquid coolant into an inlet conduit in the cooling device;

flowing the liquid coolant from the inlet conduit to a first top tank of a first radiator in the cooling device;

moving the liquid coolant, via a connecting conduit, between a first bottom tank of the first radiator and a second bottom tank of a second radiator in the cooling device, the second radiator being parallel to the first radiator and angled at a slope relative to a bottom panel of the cooling device, wherein the first and second radiators are inserted in respective first and second lateral slots at the sloped angle or a support stand mounted on the bottom panel;

expelling the liquid coolant, via an outlet conduit in the cooling device, from a second top tank of the second radiator; and cooling at least one of the first radiator and the second radiator with an airflow through the cooling device, the air flow in a path parallel to the bottom panel from a front panel toward a rear panel, wherein the first radiator and the second radiator are mounted at the sloped angle relative to the bottom panel between the front panel and rear panel in the path of the air flow.

16. The method of claim 15, wherein the liquid coolant flows through tubes in each of the first radiator and the second radiator extending from the first and second top tanks to the respective first and second bottom tanks.

17. The method of claim 15, wherein the cooling further comprises directing the airflow through the first radiator and the second radiator using a fan.

\* \* \* \* \*